(12) United States Patent
Kemerer et al.

(10) Patent No.: US 8,614,137 B2
(45) Date of Patent: Dec. 24, 2013

(54) DUAL CONTACT TRENCH RESISTOR IN SHALLOW TRENCH ISOLATION (STI) AND METHODS OF MANUFACTURE

(75) Inventors: Timothy W. Kemerer, Essex Junction, VT (US); James S. Nakos, Essex Junction, VT (US); Steven M. Shank, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 237 days.

(21) Appl. No.: 13/025,501

(22) Filed: Feb. 11, 2011

(65) Prior Publication Data
US 2012/0205776 A1    Aug. 16, 2012

(51) Int. Cl.
*H01L 21/76*    (2006.01)
*H01L 29/86*    (2006.01)

(52) U.S. Cl.
USPC   438/430; 257/508; 257/E29.02; 257/E21.545

(58) Field of Classification Search
USPC ............. 438/430; 257/508, 536, E29.02, 257/E21.545, E21.004
See application file for complete search history.

(56) References Cited

U.S. PATENT DOCUMENTS

| | | | |
|---|---|---|---|
| 4,686,552 A * | 8/1987 | Teng et al. ............... 257/68 |
| 4,933,739 A | 6/1990 | Harari | |
| 7,498,657 B2 | 3/2009 | Chi | |
| 7,560,761 B2 | 7/2009 | Cheng et al. | |
| 7,601,602 B2 | 10/2009 | Aitken et al. | |
| 7,723,800 B2 | 5/2010 | Moens et al. | |
| 7,759,189 B2 | 7/2010 | Kemerer et al. | |
| 2007/0026632 A1* | 2/2007 | Yamamoto ............... 438/424 |
| 2007/0158725 A1 | 7/2007 | Cheng et al. | |
| 2009/0032906 A1 | 2/2009 | Ostermann et al. | |
| 2010/0025813 A1 | 2/2010 | Kemerer et al. | |
| 2010/0025814 A1 | 2/2010 | Kemerer et al. | |
| 2010/0029055 A1 | 2/2010 | Kemerer et al. | |

* cited by examiner

*Primary Examiner* — Wensing Kuo
(74) *Attorney, Agent, or Firm* — Anthony Canale; Roberts Mlotkowski Safran & Cole, P.C.

(57) ABSTRACT

The invention relates to a semiconductor structures and methods of manufacture and, more particularly, to a dual contact trench resistor in shallow trench isolation (STI) and methods of manufacture. In a first aspect of the invention, a method comprises forming a trench in a substrate; forming a first insulator layer within the trench; forming a first electrode within the trench, on the first insulator layer, and isolated from the substrate by the first insulator layer; forming a second insulator layer within the trench and on the first electrode; and forming a second electrode within the trench, on the second insulator layer, and isolated from the substrate by the first insulator layer and the second insulator layer.

25 Claims, 11 Drawing Sheets

DUAL CONTACT TRENCH RESISTOR IN SHALLOW TRENCH ISOLATION (STI) AND METHODS OF MANUFACTURE

FIELD OF THE INVENTION

The invention relates to semiconductor structures and methods of manufacture and, more particularly, to a dual contact trench resistor in shallow trench isolation (STI) and methods of manufacture.

BACKGROUND

The use of resistors and capacitors in combination is common in current integrated circuits. These integrated circuits include resonant circuits and "system-on-chip" circuits that integrate analog, digital, and passive devices on a semiconductor substrate. As performance requirements of semiconductor devices increase, and dimension requirements of such devices decrease, resistors and capacitors also require greater performance and lesser dimensions.

However, structures such as planar resistors and metal-insulator-metal (MIM) capacitors cannot achieve these requirements of increasing capacitance or resistance while minimizing dimensions, without using exotic materials and/or larger-area semiconductor devices. Further, resistor and capacitor components need to be radiation-hardened to withstand radiation events, e.g., harden static random access memory (SRAM).

Accordingly, there exists a need in the art to overcome the deficiencies and limitations described hereinabove.

SUMMARY

In a first aspect of the invention, a method comprises forming a trench in a substrate; forming a first insulator layer within the trench; forming a first electrode within the trench, on the first insulator layer, and isolated from the substrate by the first insulator layer; forming a second insulator layer within the trench and on the first electrode; and forming a second electrode within the trench, on the second insulator layer, and isolated from the substrate by the first insulator layer and the second insulator layer.

In another aspect of the invention, a method comprises forming a shallow trench isolation (STI) structure in a substrate; forming a trench through the STI and extending into the substrate; forming a first insulator layer within the trench; forming a first electrode within the trench, on the first insulator layer, and isolated from the substrate by the first insulator layer; forming a second insulator layer within the trench and on the first electrode; and forming a second electrode within the trench, on the second insulator layer, and isolated from the substrate by the first insulator layer and the second insulator layer, the second electrode being independent of the first electrode. The forming of the trench comprises scaling the trench to one of increase and decrease a surface area of the first electrode and the second electrode thereby one of increasing and decreasing, respectively, a resistance of a structure.

In yet another aspect of the invention, a structure comprises a first insulator layer provided within a trench; a first electrode provided within the trench, on the first insulator layer, and isolated from a substrate by the first insulator layer; a second insulator layer provided within the trench and on the first electrode; and a second electrode provided within the trench, on the second insulator layer, and isolated from the substrate by the first insulator layer and the second insulator layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the dual contact trench resistor in STI, which comprises the structures of the present invention. In still further embodiments, a method in a computer-aided design system is provided for generating a functional design model of the dual contact trench resistor in STI. The method comprises generating a functional representation of the structural elements of the dual contact trench resistor in STI.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a semiconductor structures and methods of manufacture and, more particularly, to a dual contact trench resistor in shallow trench isolation (STI) and methods of manufacture. More specifically, the invention is directed to a coaxial, isolated resistor structure including a high resistance value and at least two independent, contactable electrodes isolated laterally and vertically from a substrate or well and from each other. This is accomplished by forming a deep vertical trench structure, including the at least two electrodes (e.g., a long electrical path transverse to a plane of the substrate). The at least two electrodes are contacted to form the dual contact trench resistor.

Advantageously, the structure of the present invention includes reduced dimensions compared to, for example, a backend planar resistor structure. Further, the structure of the invention includes doped polysilicon materials instead of more exotic materials required in the backend planar resistor structure, yet still achieves a high range of resistance values. In addition, the invention allows for a smaller, radiation-tolerant or radiation-hardened (rad-hard) SRAM design by providing more resistance per unit area than the backend planar resistor structure, which in turn allows for more compact cell designs.

Figure 1:
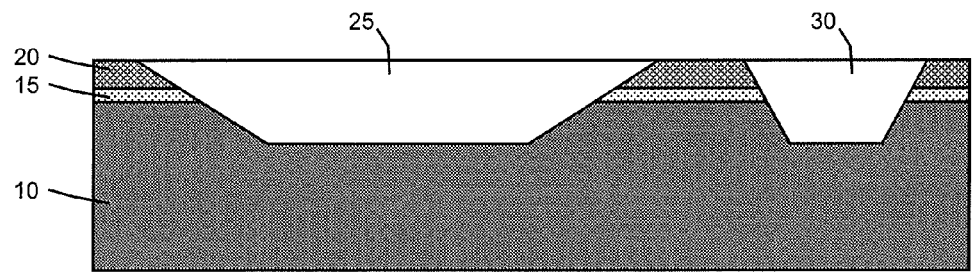
FIG. 1 shows a beginning structure and processes for fabricating the structure in accordance with aspects of the invention.

FIG. 1 shows a beginning structure and processes for fabricating the structure in accordance with aspects of the invention. The structure includes a substrate 10 (e.g., a wafer body)

that, in embodiments, may include any bulk substrate, such as silicon. A hard mask pad film 15 is formed over and directly in contact with the substrate 10, and may include an oxide. The film 15 may be formed through any conventional oxidation process or a chemical vapor deposition (CVD) process. In one illustrative, non-limiting example, the oxide film 15 may include a thickness of approximately 10-500 Å (angstroms), and more specifically between 10-100 Å, and even more specifically 10-50 Å; although other dimensions are contemplated by the invention.

Still referring to FIG. 1, a hard mask or pad film 20 is formed over and directly in contact with the film 15, and in embodiments, may include a nitride or other material that can be selectively removed during subsequent etching processes. The film 20 may be formed through a CVD process, and may include a thickness of approximately 50-3,000 Å, preferably, approximately 500-1,200 Å, although other thickness are also contemplated by the invention. Shallow trench isolation (STI) structures 25 and 30 are formed into the films 15, 20 and the substrate 10 through a process including, for example, conventional lithography etching and deposition processes. For example, a resist can be formed on the film 20 and exposed to light to form openings. A Reactive Ion Etch (RIE), for instance, can then form trenches in the structure, e.g., through the films 20, 15 and into the substrate 10. The trenches can then be filled with insulative materials. In embodiments, each of the STI structures 25 and 30 may include an oxide, for example. A surface of the structure can then be planarized using a chemical mechanical polishing (CMP).

Figure 2:
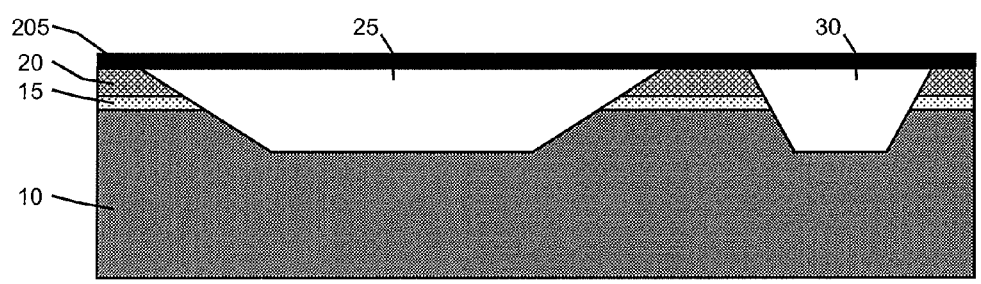
FIGS. 2-15 show intermediate structures and respective processes for fabricating the structures in accordance with an aspect of the invention.

Referring to FIG. 2, a nitride cap 205 is formed over and directly in contact with the film 20 and the STI structures 25, 30. In embodiments, the nitride cap 205 may include a thickness of approximately 50-3,000 Å with a preferable thickness of approximately 50-1,200 Å, although other thicknesses are also contemplated by the invention. The nitride cap 205 may be deposited using conventional CVD processes.

Figure 3:
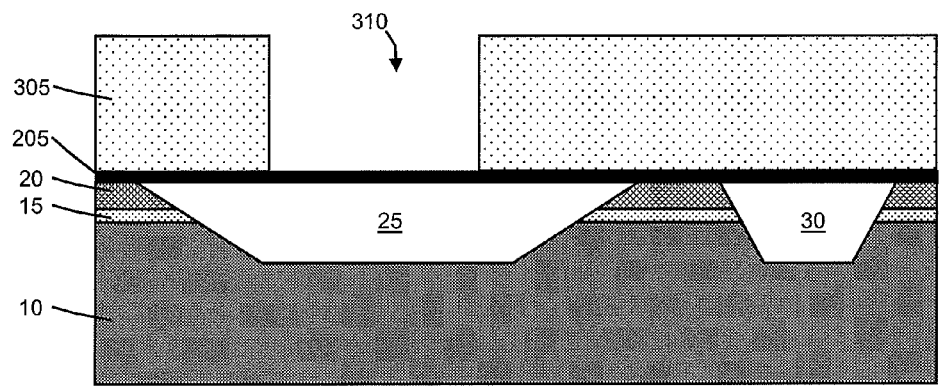

Referring to FIG. 3, a photoresist layer 305 is formed over and directly in contact with the nitride cap 205. In embodiments, the photoresist layer 305 may be deposited using any conventional deposition process, such as a spin-on process and/or a CVD. An opening 310 is formed into the photoresist layer 305 via a photolithographic process (e.g., an expose and develop process). The opening 310 is aligned with the underlying STI structure 25.

Figure 4:
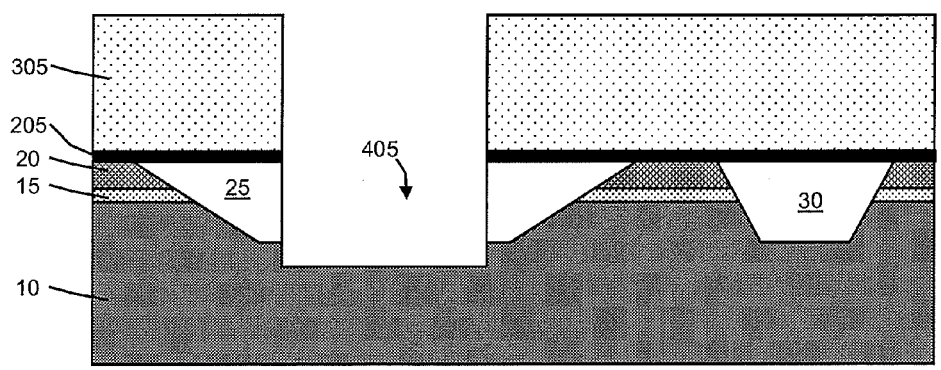

Referring to FIG. 4, a trench 405 is formed into the nitride cap 205, the STI structure 25, and the substrate 10 using a conventional etching process. For example, the trench 405 can be formed by a conventional RIE process. In embodiments, the trench 405 extends into the substrate 10 and may have a diameter or cross section of about 0.85 μm, although other dimensions are also contemplated by the present invention. The photoresist layer 305 is later removed.

Figure 5:
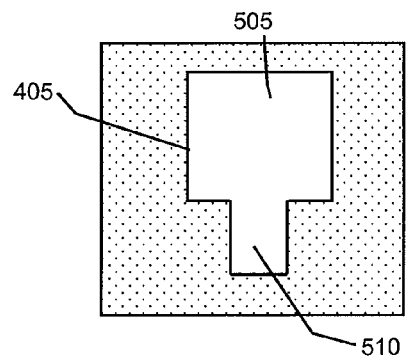

FIG. 5 shows a top view of the trench 405 formed in FIG. 4. As shown in FIG. 5, a shape of the trench 405 is a "T" shape, including a wide section 505 and a narrow section 510. In embodiments, the trench 405 may include a length of approximately 0.85 μm, the wide section 505 may include a width of approximately 0.64 μm, and the narrow section 510 may include a width of approximately 0.21 μm; although other dimensions are contemplated by the present invention.

Figure 6:
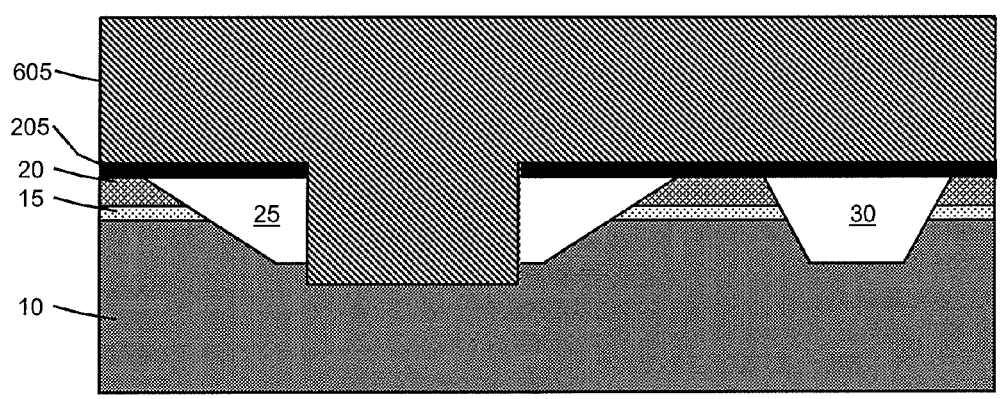

Referring to FIG. 6, the photoresist layer 305 is stripped, and an insulator layer 605 is deposited in the trench 405 and on the nitride cap 205. In embodiments, the insulator layer 605 is a boron-doped silicate glass (BSG) layer 605 formed over and directly in contact with the nitride cap 205 and into the trench 405. The insulator layer 605 can be deposited using any conventional deposition process. It should be understood that a thickness of the layer 605 can be adjusted based on the design of the structure of the invention.

Figure 7:
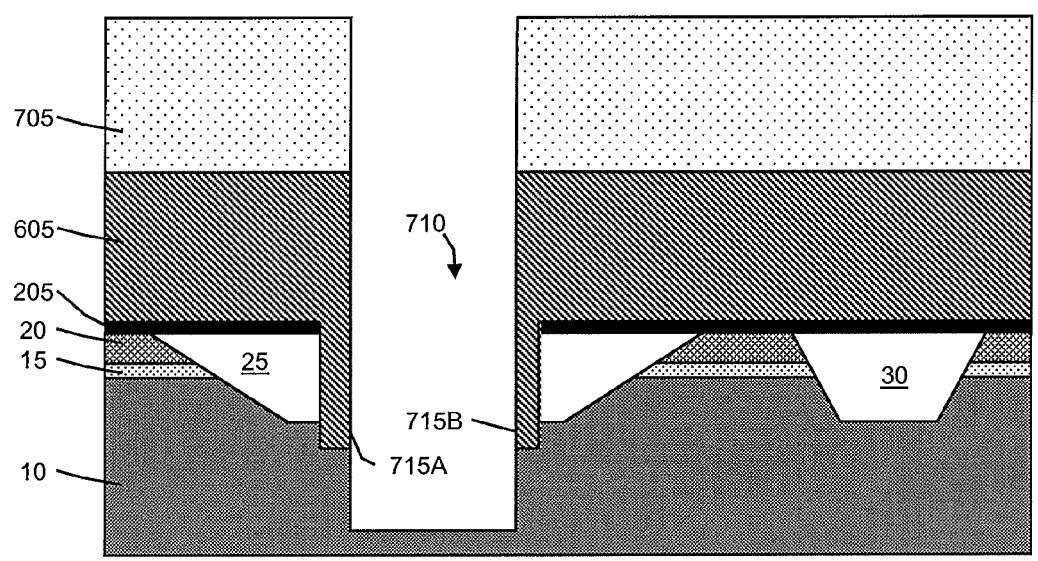

Referring to FIG. 7, a photoresist layer 705 is formed over and directly in contact with the layer 605, using any conventional deposition process. In embodiments, an opening may be foamed into the photoresist layer 705 via a photolithographic process (e.g., an expose and develop process), which is aligned (e.g., coincident) with the underlying STI structure 25 and more specifically with the filled trench 405. Using a conventional etching process, a deep trench 710 is formed through the layer 605 and into the substrate 10. The trench 710 is formed within the layer 605 formed within the trench 405. In this way, the layer 605 will form shoulders 715A and 715B approximately near a junction of the STI 25 and the substrate 10 during a subsequent etch process. In embodiments, the vertical trench 710 may extend approximately 5-10 microns below a surface of the substrate 10, although other depths are also contemplated by the present invention. This vertical depth may be adjusted to set a resistance of the resistor of the invention, and is independent of any other layer that forms the resistor.

Figure 8:
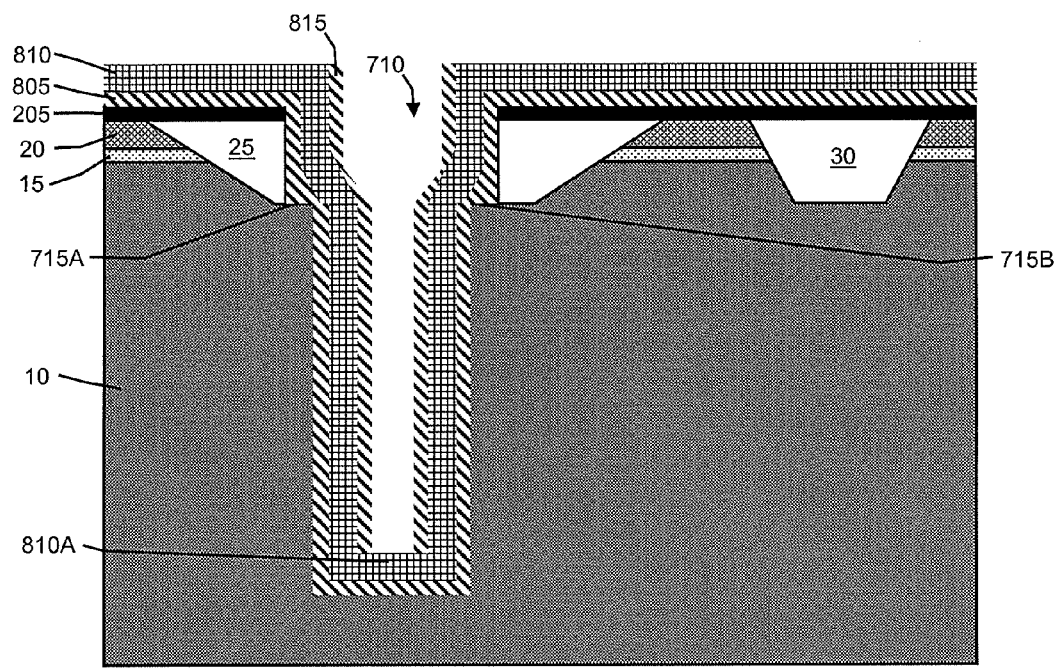

Referring to FIG. 8, the layer 605 and the photoresist layer 705 are removed, using conventional processes. For example, in embodiments, the photoresist layer 705 may be removed during the etching process that formed the trench 710. The layer 605 may be removed using a wet etching process, with the underlying nitride cap 205 acting as an etch stop layer. This etching step also removes the layer 605 formed on the shoulders 715A, 715B. In this etching process, the nitride cap 205 may be slightly thinned.

Still referring to FIG. 8, a series of layers 805, 810, and 815 are formed over and directly in contact with the structure, preferably within the trench 710 and on the shoulders 715A, 715B, using any conventional deposition process. In embodiments, the layer 805 may be an oxide layer, such as, for example, an oxynitride oxide layer. The oxynitride oxide layer 805 may act as an insulator layer, insulating the layer 810 from the substrate 10. The insulator layer 805 may be about 20 nm in thickness; although the insulator layer 805 can be other dimensions contemplated by the present invention. The insulator layer 805 may be formed with a slope at or near the shoulders 715A, 715B, such that the insulator layer 805 is greater in thickness in its sloped regions than in its vertical regions. In embodiments, the insulator layer 805 may be formed with a slope of approximately 60°-80° with a preferable slope of approximately 70°, although other slopes are also contemplated by the invention.

Still referring to FIG. 8, in embodiments, the layer 810 may be a polysilicon layer that can be lightly-doped with arsenic and which is formed over and directly in contact with the insulator layer 805. The polysilicon layer 810 acts as a first electrode of the resistor of the invention. The polysilicon layer 810 may be about 100 nm in thickness; although other dimensions are contemplated by the present invention in order to tune a resistance between the insulator layer 805 and the overlying polysilicon layer 810. The polysilicon layer 810 may be formed with a slope at or near the shoulders 715A, 715B, such that the polysilicon layer 810 is greater in thickness in its sloped regions than in its vertical regions. In embodiments, the polysilicon layer 810 may be formed with a slope of approximately 60°-80° with a preferable slope of approximately 70°, although other slopes are also contemplated by the invention.

In embodiments, the layer 815 may be a second insulator layer such as oxide or oxynitride oxide layer, which is formed over and directly in contact with the polysilicon layer 810. The second insulator layer 815 acts as an insulator layer, insulating portions of the polysilicon layer 810. The insulator layer 815 may be about 7 nm in thickness; although other dimensions are also contemplated by the present invention. The insulator layer 815 may be formed with a slope at or near the shoulders 715A, 715B, such that the insulator layer 815 is greater in thickness in its sloped region than in its vertical region. In embodiments, the insulator layer 815 may be formed with a slope of approximately 60°-80° with a preferable slope of approximately 70°, although other slopes are also contemplated by the invention.

In embodiments, the insulator layer 815 can be etched (e.g., anisotropic etch), to expose the underlying layer 810 on the surface of the structure and at a bottom 810A of the trench 710. Insulator coverage remains on sidewalls of the trench 710 due to dimensional coverage (e.g., additional thickness) on the sloped sidewalls, resulting from the layers 805, 810, 815 being formed with the slopes at or near the shoulders 715A, 715B and the layers 810, 815 being formed with additional thickness at their sloped regions. In other words, the additional thickness of the sloped insulator layer 815 at the shoulders 715A, 715B before etching allows the polysilicon layer 810 to be exposed at the bottom 810A, while the insulator layer 815 remains intact. In embodiments, the width of the trench 710 has a minimum width to ensure that the layers 805, 810, and 815 do not provide a pinch off in the trench 710.

Figure 9:
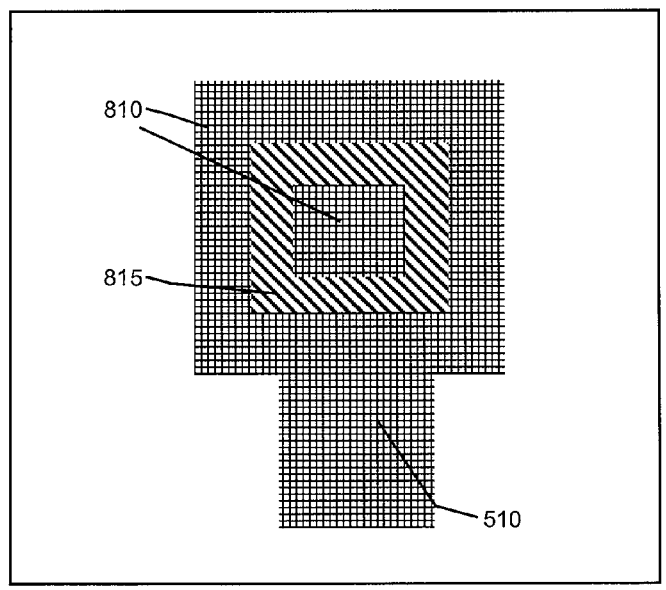

Referring to FIG. 9, a top view of the layers 810, 815 formed in the trench 710 in FIG. 8 is shown. As shown, the polysilicon layer 810 effectively pinches off the narrow section 510 of the trench 410 in FIGS. 4-5.

Figure 10:
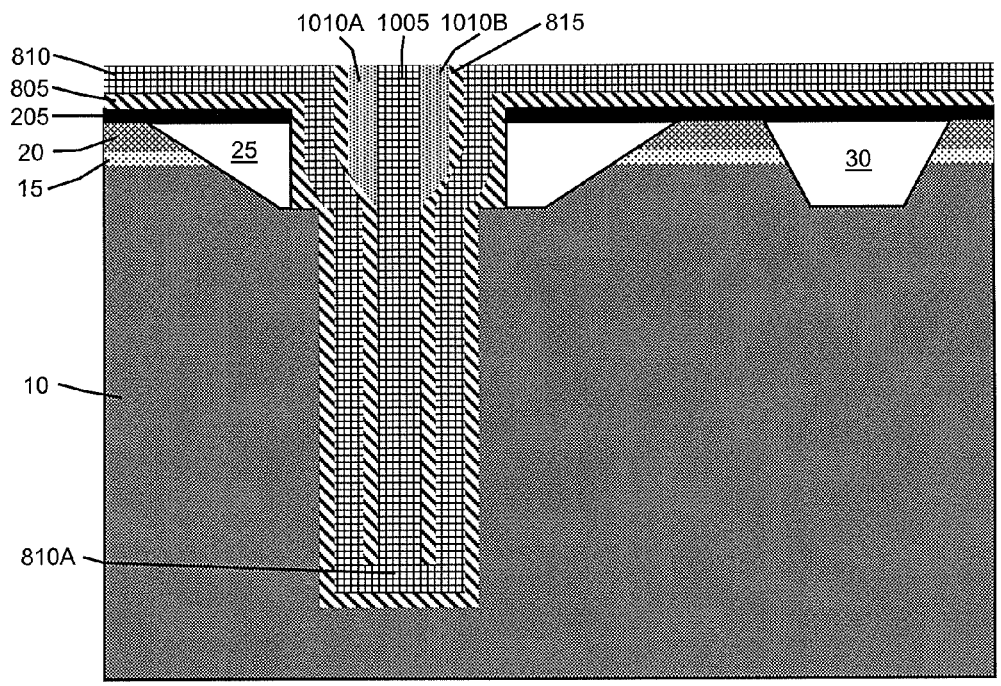

Referring to FIG. 10, a second polysilicon layer 1005 is formed over and directly in contact with the second insulator layer 815 and makes contact with the polysilicon layer 810 of the bottom exposed portion 810A. The second polysilicon layer 1005 is in physical and electrical contact with the polysilicon layer 810 at the bottom exposed portion 810A. The second polysilicon layer 1005 can be slightly-doped with arsenic and acts as a second electrode of the resistor of the invention. In embodiments, the second polysilicon layer 1005 may be about 200 nm in thickness; although other dimensions are also contemplated by the present invention. In embodiments, a resistance may be generated between the two polysilicon layers 810, 1005. In further embodiments, the polysilicon layers 805, 1005 can be any appropriate conductive materials.

Still referring to FIG. 10, in embodiments, the two polysilicon layers 810, 1005 may be formed of a polysilicon, a metal, or a metal silicide. In any scenario, the polysilicon layers 810, 1005 form electrodes for the coaxial resistor of the invention. Also, the polysilicon layer 1005 is exposed on an upper surface of the structure to form a contact region. The lower polysilicon layer 810 is an independent electrode, isolated from the wafer body (e.g., the substrate 10) both laterally and vertically. In this manner, electron hole pairs created by, for example, radiation or other unwanted charging events, are not swept to the first electrode (e.g., the lower polysilicon layer 810) as it is isolated from the wafer body. As such, the electrons hitting the wafer body do not disrupt the resistor. The layers 805, 810, 815, and 1005 may be changed and/or adjusted (e.g., in material and/or thickness) to set a resistance of the resistor of the invention.

Still referring to FIG. 10, as an optional embodiment, the top polysilicon layer 1005 may be etched away using a conventional etching process, which results in a hole. The hole may then be filled with a dielectric material such as, for example, an oxide. A portion of the oxide (e.g., a central portion) may then be etched away using a conventional directional etching process to form sidewall spacers 1010A and 1010B. The sidewall spacers 1010A, 1010B add margins to effectively eliminate any potential short circuits of the resistor of the invention. An open space between the sidewall spacers 1010A, 1010B may then be filled with additional polysilicon material 1005, which is planarized through conventional processes.

Figure 11:
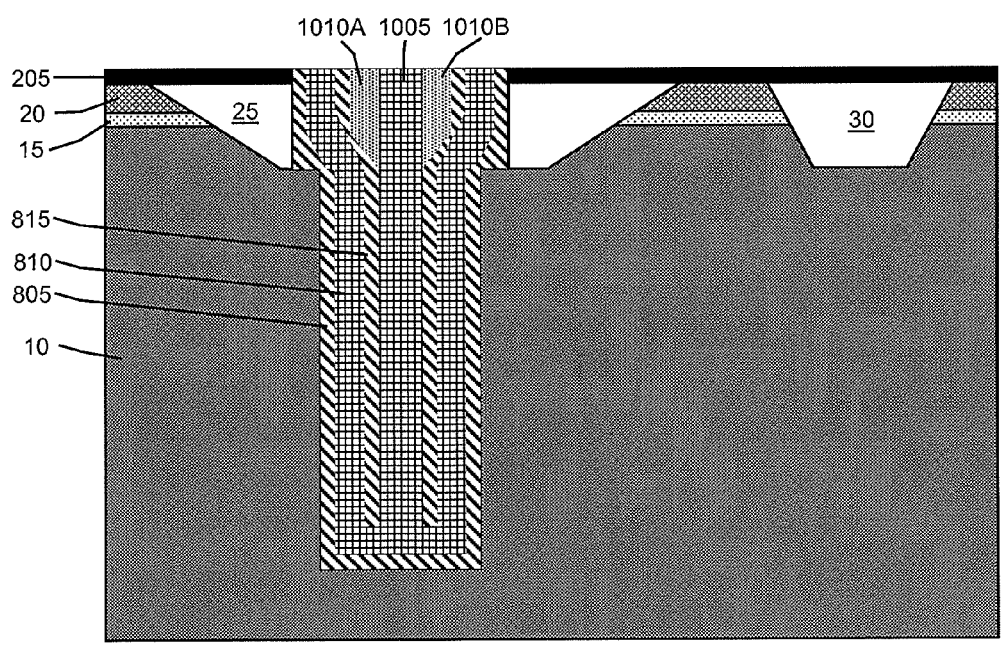

In FIG. 11, portions of the layers 805, 810, 815, 1005 and the sidewall spacers 1010A, 1010B deposited on the nitride cap 205 are etched or polished away using a conventional etching or polishing process. In embodiments, the nitride cap 205 may act as an etch stop layer for this process.

Figure 12:
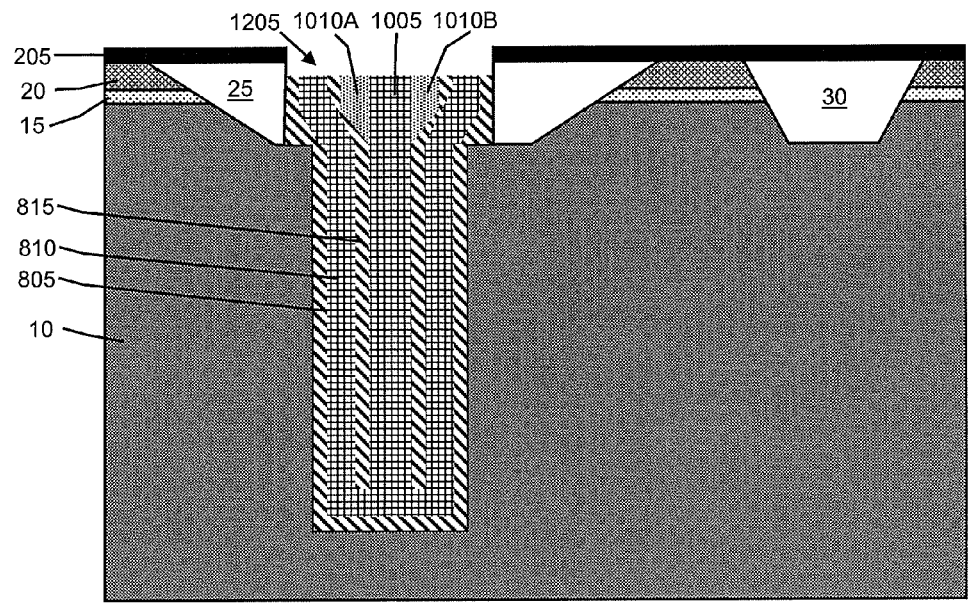

Referring to FIG. 12, the layers 805, 810, 815, 1005 and the sidewall spacers 1010A, 1010B are etched to form a recess 1205 within the STI structure 25. In embodiments, the layers may be etched to about half of a depth of the combination of nitride cap 205 and the films 20, 15. In embodiments, the polysilicon layers 810, 1005 may be etched away using a conventional etch process, while the insulator layers 805, 815 may be removed using a deglaze process utilizing a HFEG (hydrofluoric acid diluted by ethylene glycol) solution.

Figure 13:
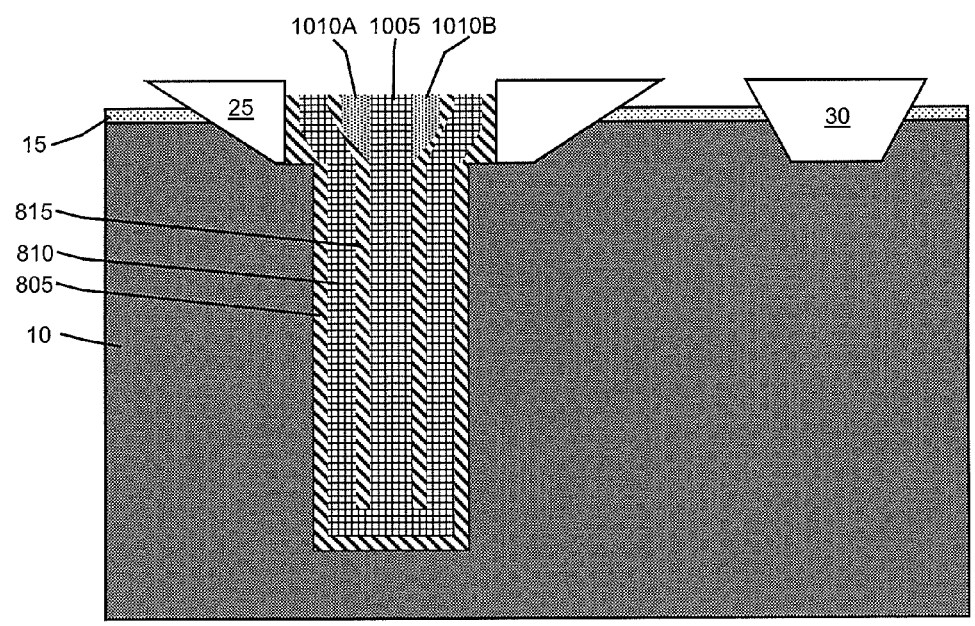

In FIG. 13, the nitride cap 205 and the pad film 20 are removed using a hot phosphoric removal process, such that the STI structures 25, 30 are higher than the oxide film 15. In this way, the layers 805, 810, 815, 1005 and the sidewall spacers 1010A, 1010B are above the surface of the substrate 10.

Figure 14:
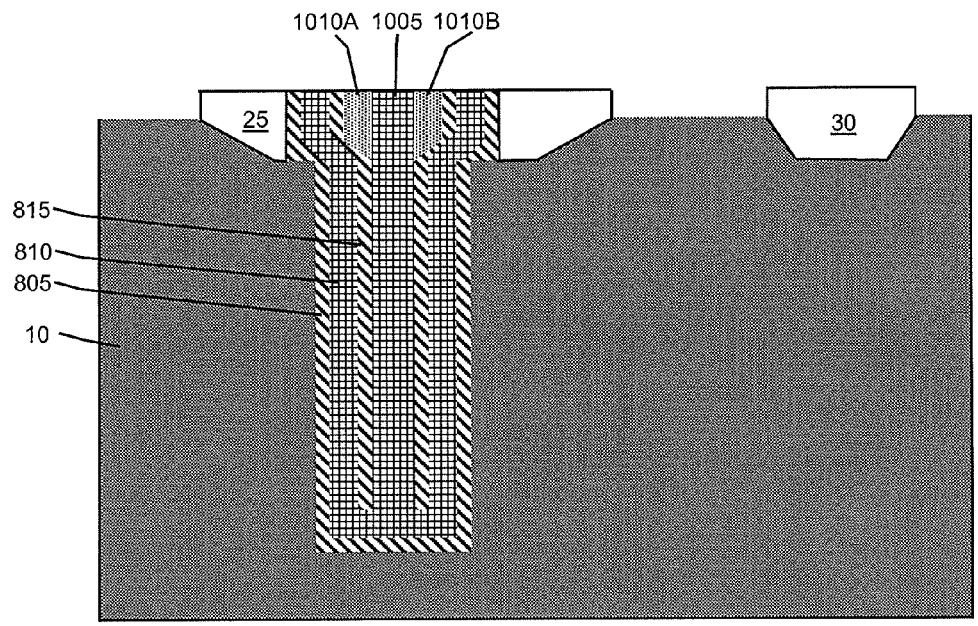

In FIG. 14, the oxide film 15 is removed using an HF process. The HF process removes portions of the oxide fill in the STI structures 25, 30, but only slightly impacts the insulator layers 805, 815.

Figure 15:
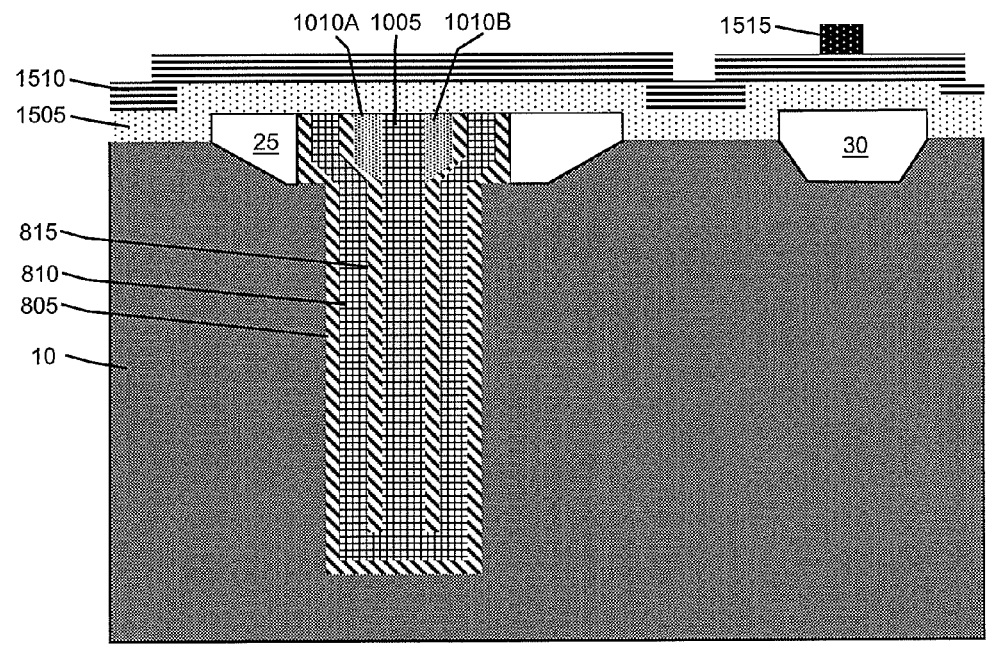
Figure 16:
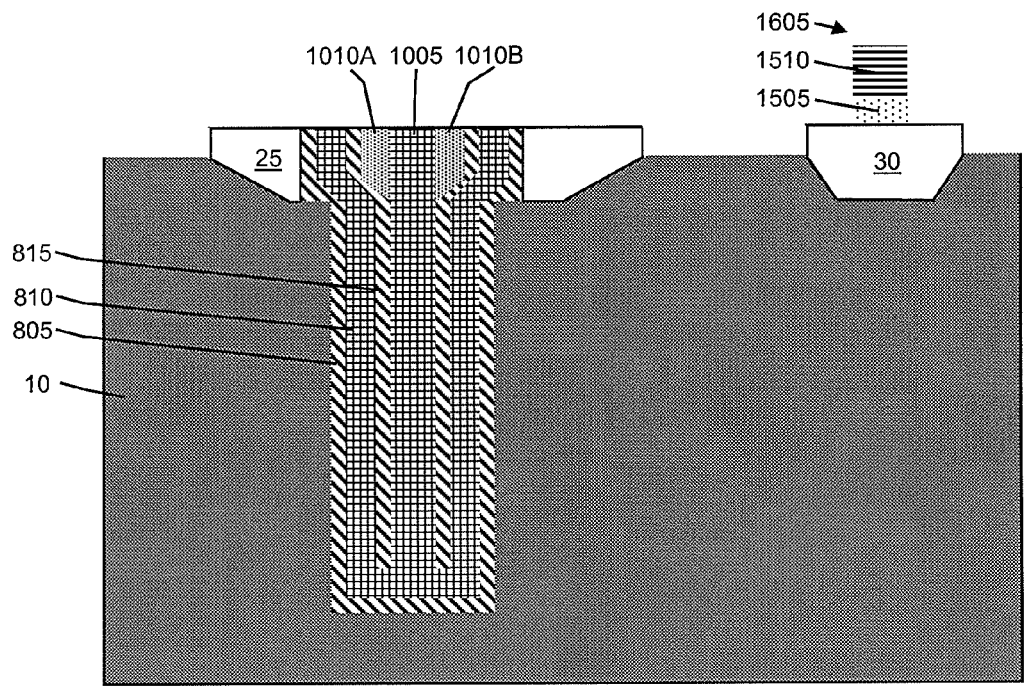
FIGS. 16-18 show a final structure and respective processes for fabricating the structure in accordance with the invention.

FIGS. 15-16 show processing through a formation of a gate structure. In FIG. 15, in embodiments, an oxide or other dielectric material 1505 may be deposited on the surface of the structure. A polysilicon conductor material 1510 may be deposited over and directly in contact with the oxide layer 1505. A mask 1515 is then deposited and patterned in areas of gate formation using a conformal deposition process. Thereafter, the polysilicon material 1510 and the oxide material 1505 are etched using a conventional etching process. In this way, as shown in FIG. 16, a vertical gate structure 1605 may be formed from the oxide material 1505 and polysilicon conductor material 1510. Additionally, gate sidewalls and spacers, for example, can also be formed using conventional processes.

Figure 17:
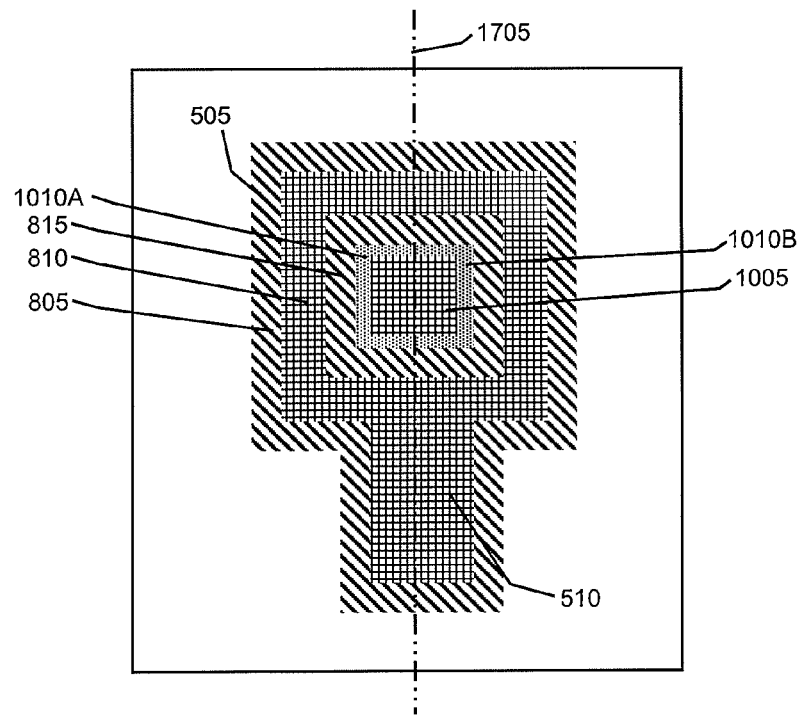

FIG. 17 shows a top view of the layers 805, 810, 815, 1005, 1010A, and 1010B of the structure in FIG. 16. In embodiments, the polysilicon layer 810 may effectively pinch off the narrow section 510 of the trench 405 in FIGS. 4-5, such that the polysilicon layer 1005 is formed in only the wide section 505 of the trench 405.

Figure 18:
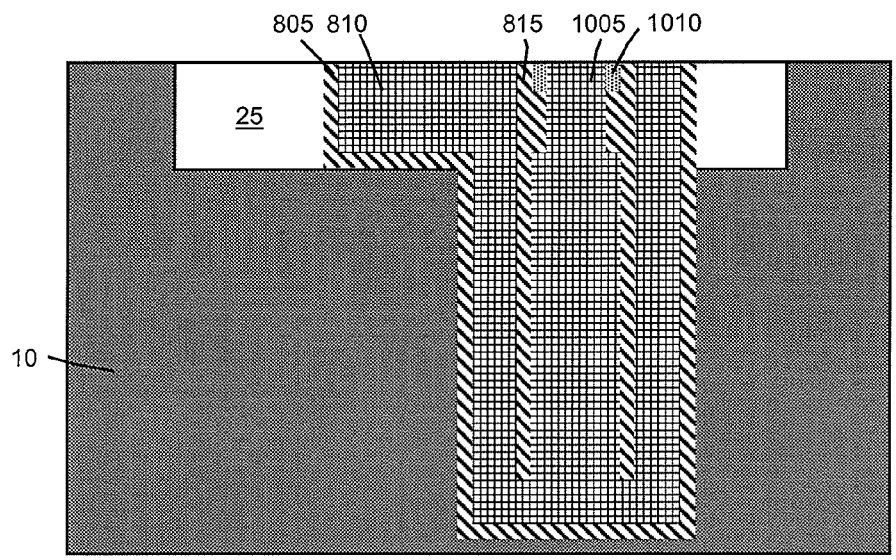

FIG. 18 shows another cross-sectional view of the structure in FIG. 16 at a cross-section line 1705 in FIG. 17. In this view, the substrate 10, the STI structure 25, the layers 805, 810, 815, and 1005, and sidewall spacers 1010 are shown.

Figure 19:
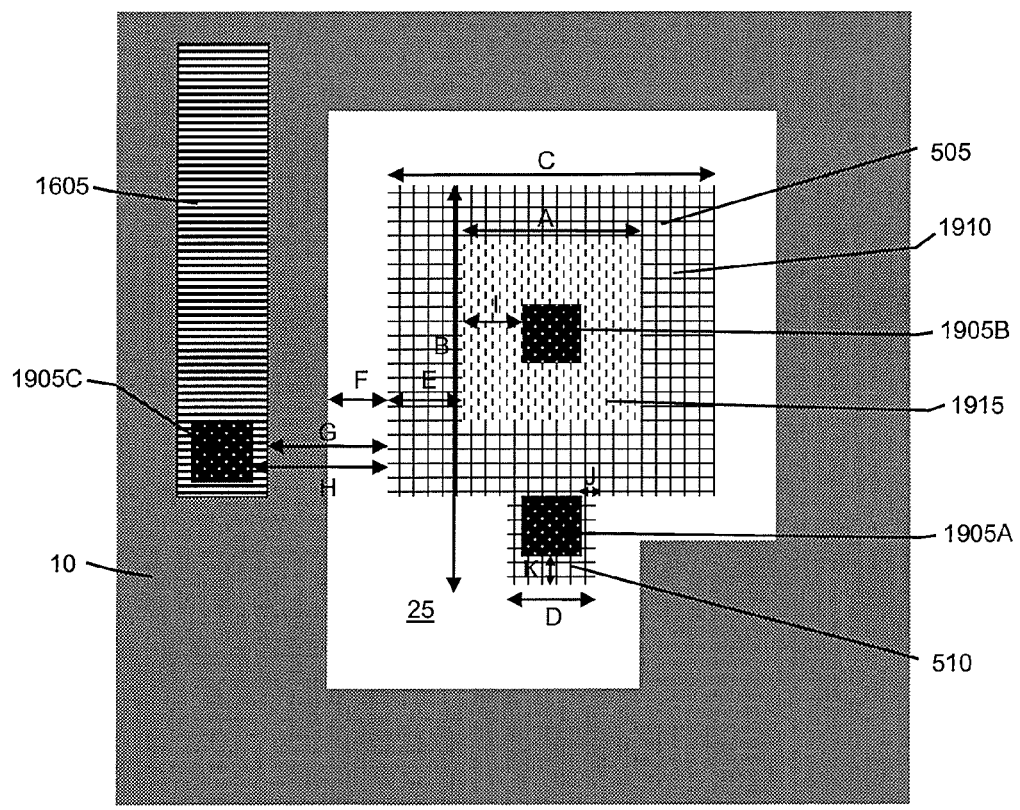
FIG. 19 shows an alternative final structure and respective processes for fabricating the structure in accordance with the invention.

FIG. 19 shows another top view of the structure in FIG. 16. In embodiments, a metal material may be formed over and directly in contact with selective portions of the polysilicon layers 810, 1005 and the gate structure 1605 to form metal contacts 1905A, 1905B, and 1905C, respectively. The contact 1905A of the first polysilicon layer 810 may not be landed. The layers 805, 810, 815, and 1005 of the structure fill areas 1910 and 1915. The area 1910 represents an area of the trench 405 in FIG. 4, and the area 1915 represents an area of the trench 710 in FIG. 7. In embodiments, the following dimensions of the structures are contemplated, as shown in Table 1 below. It should be understood that these dimensions are exemplary dimensions, and should not be considered a limiting feature of the invention.

TABLE 1

| Dimension (Description) | Size (um) |
| --- | --- |
| A (dimensions (length and width) of the area 1915 (or trench 710)) | =0.40 |
| B (length of the area 1910 (or trench 405)) | >=0.85 |
| C (width of the wide section 505 of the area 1910) | =0.64 |
| D (width of the narrow section 510 of the area 1910) | =0.21 |
| E (distance between a width edge of the area 1915 and a width edge of the wide section 505 of the area 1910) | >=0.12 |
| F (distance between the width edge of the wide section 505 of the area 1910 and a width edge of the STI structure 25) | >=0.08 |
| G (distance between the width edge of the wide section 505 of the area 1910 and a width edge of the gate structure 1605) | >=0.10 |
| H (distance between the width edge of the wide section 505 of the area 1910 and a width edge of the metal contact 1905C) | >=0.13 |
| I (distance between a width edge of the metal contact 1905B and the width edge of the area 1915) | =0.14 |
| J (distance between a width edge of the metal contact 1905A and a width edge of the narrow section 510 of the area 1910) | =0.045 |
| K (distance between a length edge of the metal contact 1905A and a length edge of the narrow section 510 of the area 1910) | >=0.08 |

Figure 20:
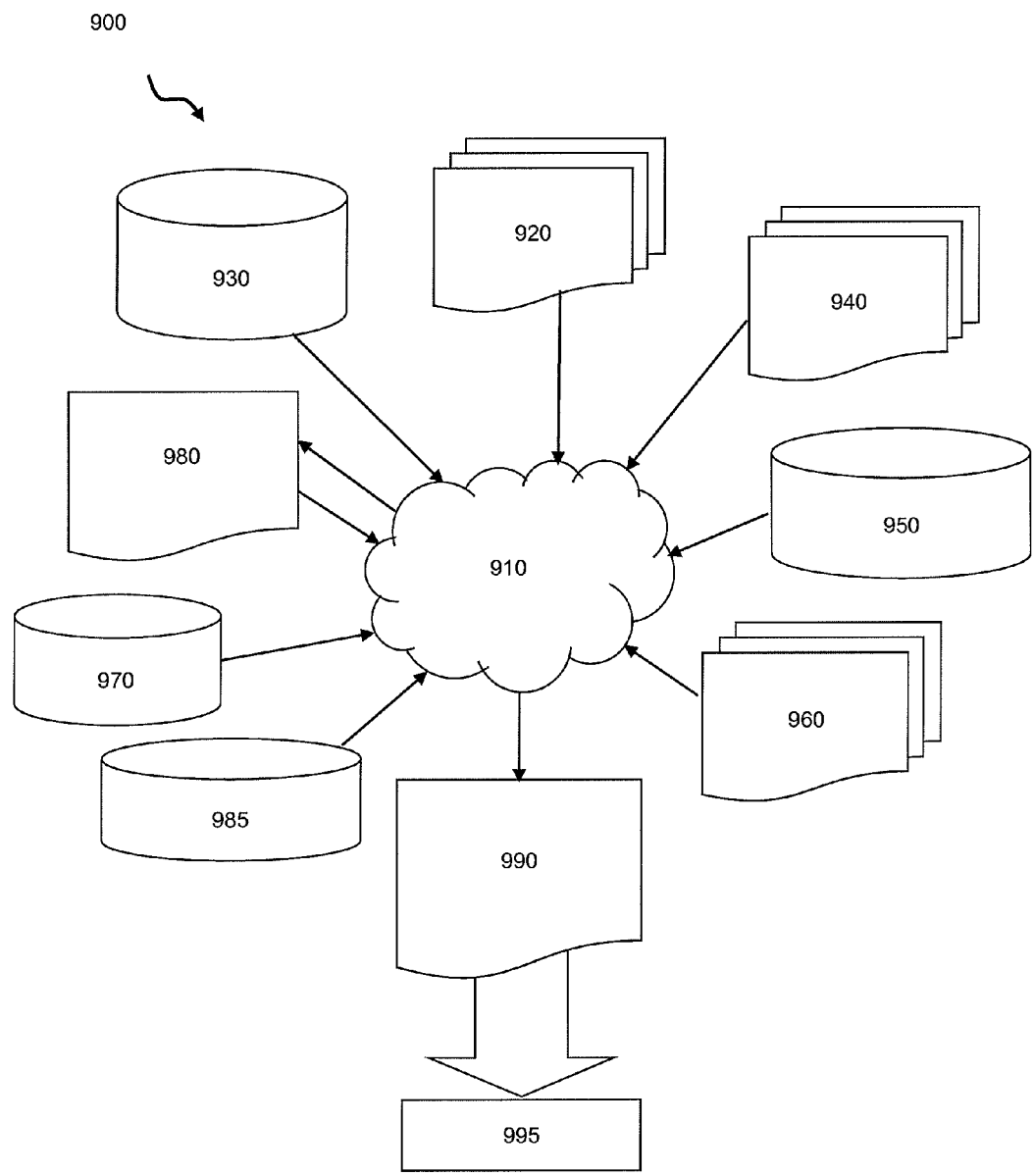
FIG. 20 is a flow diagram of a design process used in semiconductor design, manufacture, and/or test.

FIG. 20 is a flow diagram of a design process used in semiconductor design, manufacture, and/or test. FIG. 20 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-19. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-19. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-19 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-19. In one embodiment, design structure 990 may comprise a compiled, executable HDL simulation model that functionally simulates the devices shown in FIGS. 1-19.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-19. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming a trench in a substrate;
   forming a first insulator layer within the trench;
   forming a first electrode within the trench, on the first insulator layer, and isolated from the substrate by the first insulator layer;
   forming a second insulator layer within the trench and on the first electrode, wherein the second insulator layer is formed with a sloped region having a thickness greater than vertical regions; and
   forming a second electrode within the trench, on the second insulator layer, and isolated from the substrate by the first insulator layer and the second insulator layer.

2. The method of claim 1, wherein:
   the first electrode and the second electrode are independent from each other; and
   the second electrode is in contact with the first electrode at an exposed portion of the first electrode.

3. The method of claim 1, wherein the forming of the first electrode and the second electrode comprises depositing one of a polysilicon material, a metal, and a metal silicide.

4. The method of claim 1, further comprising forming metal contacts on exposed regions of the first electrode and the second electrode.

5. The method of claim 1, further comprising forming a sidewall spacer comprising oxide within the trench between the second electrode and the second insulator layer.

6. The method of claim 1, wherein the forming of the trench comprises forming the trench through a shallow trench isolation (STI) structure and extending into the underlying substrate.

7. The method of claim 1, wherein the forming of the first electrode comprises depositing a polysilicon material into the trench which pinches off a portion of the trench such that the forming of the second electrode comprises depositing the polysilicon material into another portion of the trench.

8. The method of claim 1, wherein the forming of the first electrode and the second electrode comprises forming the first electrode and the second electrode such that the first electrode and the second electrode are surrounded, at least partially, by a STI structure.

9. The method of claim 1, further comprising forming at least two STI structures, wherein the trench is formed in one of the STI structures.

10. The method of claim 1, further comprising one of etching and polishing the first electrode, the first insulator layer, the second electrode, and the second insulator layer to a surface of a structure.

11. The method of claim 1, wherein the trench is scalable to one of increase and decrease a surface area of the first electrode and the second electrode thereby one of increasing and decreasing, respectively, a resistance of the structure.

12. A method, comprising:
forming a shallow trench isolation (STI) structure in a substrate;
forming a trench through the STI and extending into the substrate;
forming a first insulator layer within the trench with a sloped sidewall greater than 0° which corresponds to a shoulder of the trench;
forming a first electrode within the trench, on the first insulator layer, and isolated from the substrate by the first insulator layer;
forming a second insulator layer within the trench and on the first electrode with a thickness at the sloped sidewall being greater than a thickness of vertical regions;
performing an anisotropic etch to remove the second insulator layer at a bottom of the trench and on a surface of the first electrode outside of the trench; and
forming a second electrode within the trench, on the second insulator layer, and isolated from the substrate by the first insulator layer and the second insulator layer, and the second electrode being in contact with the first electrode at the bottom of the trench,
wherein the forming of the trench comprises scaling the trench to one of increase and decrease a surface area of the first electrode and the second electrode thereby one of increasing and decreasing, respectively, a resistance of a structure.

13. The method of claim 12, wherein the forming of the first electrode and the second electrode comprises depositing one of a polysilicon material, a metal, and a metal silicide.

14. The method of claim 12, further comprising forming metal contacts on exposed regions of the first electrode and the second electrode.

15. The method of claim 12, further comprising forming a sidewall spacer comprising oxide within the trench between the second electrode and the second insulator layer.

16. The method of claim 12, wherein the forming of the first electrode comprises depositing a polysilicon material into the trench which pinches off a portion of the trench such that the forming of the second electrode comprises depositing the polysilicon material into another portion of the trench.

17. A structure comprising:
a first insulator layer provided within a trench;
a first electrode provided within the trench, on the first insulator layer, and isolated from a substrate by the first insulator layer;
a second insulator layer provided within the trench and on the first electrode,
the second insulator layer having a greater thickness at a slope region corresponding to a shoulder of the trench than a thickness at a vertical region, where the slope region is greater than 0°; and
a second electrode provided within the trench, on the second insulator layer, and isolated from the substrate by the first insulator layer and the second insulator layer.

18. The structure of claim 17, wherein:
the first electrode and the second electrode are independent from each other;
the first electrode and the second electrode are formed from one of a polysilicon material, a metal, and a metal silicide;
the first electrode and the second electrode are connected to metal contacts;
the structure further comprises a sidewall spacer comprising oxide within the trench between the second electrode and the second insulator layer;
the trench is formed through a shallow trench isolation (STI) structure and extends into the underlying substrate;
the first electrode pinches off a portion of the trench such that the second electrode is within another portion of the trench;
the first electrode and the second electrode are surrounded, at least partially, by an STI structure;
the structure further comprises at least two STI structures, wherein the trench is formed in one of the STI structures; and
the STI structures protrude above a surface of the substrate and the trench extends into the substrate.

19. The structure of claim 17, wherein the trench is scalable to one of increase and decrease a surface area of the first electrode and the second electrode thereby one of increasing and decreasing, respectively, a resistance of the structure.

20. The method of claim 1, wherein a slope of the sloped region is 60° to 80°.

21. The method of claim 20, wherein the slope of the sloped region is 70°.

22. The method of claim 1, wherein the second insulator layer is etched using an anisotropic etching process.

23. The method of claim 22, wherein the anisotropic etching process removes the second insulator layer at a bottom of the trench and on a surface of the first electrode outside of the trench.

24. The method of claim 23, wherein the second insulator layer remains on a shoulder after the anisotropic etching process due to its thickness.

25. The method of claim 17, wherein the sloped sidewall is 60° to 80° and an anisotropic etching process removes the second insulator layer at a bottom of the trench and on a surface of the first electrode outside of the trench.

* * * * *